(12) United States Patent
Ishizaka

(10) Patent No.: US 6,318,906 B1
(45) Date of Patent: Nov. 20, 2001

(54) OPTICAL COMMUNICATION MODULE

(75) Inventor: Masashige Ishizaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/395,259

(22) Filed: Sep. 13, 1999

(30) Foreign Application Priority Data

Sep. 14, 1998 (JP) .................................................. 10-259570

(51) Int. Cl.[7] ...................................................... G02B 6/36
(52) U.S. Cl. .................................. 385/88; 385/89; 385/91; 385/94
(58) Field of Search ................................. 385/88, 89, 91, 385/94; 359/152, 154, 157, 159, 163

(56) References Cited

U.S. PATENT DOCUMENTS

| | | |
|---|---|---|
| 5,422,900 | 6/1995 | Reele et al. . |
| 5,677,779 * | 10/1997 | Oda et al. .............................. 359/152 |

FOREIGN PATENT DOCUMENTS

| | | |
|---|---|---|
| 43 43 494 A1 | 6/1995 | (DE) . |
| 4-373155 | 12/1992 | (JP) . |
| 9-148675 | 6/1997 | (JP) . |

OTHER PUBLICATIONS

XP-002162475 Conference Publication No. 448; Sep. 22-25, 1997 Single Mode Fibre Transmission Using a Negative-Chirp Modulator Integrated DFB-LD Transmitter and APD Receive; H. Nakamoto et al.

XP 000699795 Special Issue on Electronic Components; OKI Technical Review 158; Apr. 1997 vol. 63;Optical Transmitter Module for 10Gbit/s Optical Communication Systems; Naoyuki Mineo et al.

XP 000394430 2001A Journal De Physique; Sep. 3, 1993, No. 9, Les Ulis France, Parasitic Element Influence on Laser Driver Performances For 1.3 MU M Fiber Optical Communication; N. Hassaine et al.

European Search Report; Dated Mar. 9, 2001.

Nakamoto et al., "10–Gbit/s Single Mode Fibre Transmission using a Negative–Chirp Modulator Integrated DFB–LD Transmitter and APD Receiver", in the 23rd European Conference on Optical Communication, vol. 1, pp. 7–10, 1997.

Doi et al., "10Gbit/s EA Modulator Driver IC with Waveform Controller", in Proceeding of General Conference of IEICE, pp. 195, C–12–67, 1998.

Nishino et al., "An Optical Transmitter for 10Gb/s Optical Transmission Systems: With an Electroabsorption Modulator Monolithically Integrated with DFB Laser and GaAs Driver IC", Technical Report of IEICE, CS94–23, OCS94–13, pp. 87–92, 1994.

Mineo et al., "A Compact EA/LD Module with Driver IC for 10Gb/s Optical Transmission Systems", Proceeding of General Conference of IEICE, C–214, pp. 214, 1994.

* cited by examiner

Primary Examiner—Mohammad Sikder
(74) Attorney, Agent, or Firm—McGinn & Gibb, PLLC

(57) ABSTRACT

A Peltier cooler is situated in a module casing, and combined with a metallic block, on which a lens is mounted. A thermistor, an electroabsorption modulator integrated DFB laser (a laser unit), a monitoring photosensor are mounted on the metallic block. A signal line of a co-planar structure which is connected with a signal input pin supplied with an external signal is laid on a ceramic substrate, under which a pedestal is formed. A part of the ceramic substrate on the pedestal is removed, and an amplifier is mounted on the pedestal in condition that it approximates to the laser unit. The laser unit is connected with the amplifier by an Au wire, and the amplifier is connected with the signal line by another Au wire. According to the aforementioned configuration, an electrical length between the signal pin and the laser unit can be shortened, and a compact optical communication module having an excellent performance in a high bit rate communication can be provided.

16 Claims, 6 Drawing Sheets

OPTICAL COMMUNICATION MODULE

FIELD OF THE INVENTION

This invention relates to an optical communication module playing an important role in an optical communication system or an optical information processing system, and especially to an optical communication module which operates with a low driving voltage, is small-sized, and shows an excellent performance in a high bit rate operation.

BACKGROUND OF THE INVENTION

On account of a recent tendency that an optical communication system is small-sized and used for a higher bit rate transmission, engineers in this field place their hopes on the development of an optical communication module having a compact size and suited for a high bit rate communication. Especially, a module having an integrated circuit with the function of a signal amplification within can operate with a low driving voltage, makes an amplifier provided for a transmitting panel unnecessary, and contributes toward small-sizing a transmitter and reducing a cost thereof, hence efforts for developing the optical communication module are actively made in various research institutions. Hitherto, a simple semiconductor laser has been used as a light source in an optical communication module, and thereby an electrical signal has been converted into an optical signal by a direct modulation system. However, with the advance of technology in the optical communication that a transmission distance becomes longer and a bit rate of the communication becomes higher, the disadvantage of the direct modulation system is actualized. That is to say, according to the direct modulation system using a semiconductor laser diode, chirping in a wavelength of an optical signal arises at the time of modulation, and the waveform of the optical signal propagating through an optical is deformed. This phenomenon becomes noticeable as the bit rate of the signal transmission becomes higher and the transmission distance becomes longer. This problem is serious especially in the transmission system using the existing 1.3 μm zero dispersion fiber. Even if the light source of 1.55 μm band corresponding to a lower transmission lose is used in order to extend the transmission distance, the transmission distance is limited because of the dispersion distortion caused by chirping.

This problems can be settled by adopting an external modulation system in which the semiconductor laser is activated at a constant optical output power and the light emitted therefrom is modulated by a modulator separated from the semiconductor laser. Then, the external optical modulator is being actively developed. At present, the optical modulators of two types are regarded as promising for this purpose, the one is a dielectric optical modulator using dielectric material, such as $LiNbO_3$ and etc., and the other one is a semiconductor optical modulator using a semiconductor, such as InP, GaAs and etc. In the aforementioned optical modulators, the semiconductor optical modulator can be integrated with the semiconductor laser, an optical amplifier, and other optical devices, and easily fabricated so that it is small seized and operates with a low driving voltage. Then, the engineers in this field place their hopes on the semiconductor optical modulator. Then, two types of the semiconductor optical modulator are worth notice. The one is an electroabsorption optical modulator, which intensity modulates a light by applying an electric field to a semiconductor and controls a light absorption coefficient thereof. In this case, an absorption edge of the light in the semiconductor is shifted to a lower wavelength region by the electric field on account of the Franz-Keldisch effect of a bulk semiconductor or the quantum confinement Stark effect in a multiple quantum well. The other one is a Mach-Zehnder type modulator, which make use of change of a refractive index of the semiconductor caused by an electrooptics effect (Pockels effect) of bulk semiconductor or the quantum confinement Stark effect. Although the Mach-Zehnder type modulator has a structure of interference type and cannot be formed into a simple linear waveguide structure, and methods for fabricating and driving it becomes complicated. On the other hand, the absorption optical modulator can remarkably reduce chirping of the wavelength as compared with the direct modulation system using the semiconductor laser, and can be monolithically integrated with the semiconductor laser without a great difficulty. So that, the results of research and development on the absorption optical modulator to be used as a light source in a transmitter module are reported by various research institutions in recent years.

On the aforementioned optical communication module which comprises an electroabsorption modulator integrated semiconductor laser light source and a built-in signal amplifier, results of developments are reported by Nakamoto et al. in the 23rd European Conference on Optical Communication, Vol. 1, pp. 7 to 10 (1997), and Doi et al. in Proceeding of General Conference of IEICE, p. 195, C-12–67 (1998). Moreover, Nishino et al. report the result of the research on the same subject on Technical Report of IEICE, CS94-23, OCS94-13, pp. 87 to 92 (1994), and Mineo et al. report the results of improvement of the characteristic of the optical communication module on Proceeding of General Conference of IEICE, C-214, p. 214 (1994). FIG. 1 shows the outline of the optical communication module developed by Nishino, Mineo et al.. As shown in FIG. 1, a semiconductor laser unit 302 composed of a light source and a modulator which are monolithically unified is mounted on a module casing 301. A signal light which is emitted from the laser unit 302 and modulated by a modulator therein is outputted through a transparent optical output port 303 formed on a part of the module casing 301. Moreover, a monitor unit 304 formed of a photodiode is situated at the back of the laser unit 302. A high frequency connector 305 serving as an input terminal is provided for the module casing 301 opposite to the optical output port 303. An amplifier 306 for amplifying a signal supplied from the high frequency connector 305 is set close to the high frequency connector 305. The amplifier 306 is connected with the laser unit 302 via a co-planar line 307 forming a signal line.

However, in the aforementioned optical communication module, it is necessary to lay the co-planar line 307 for electrically connecting the laser unit 302 with the amplifier 306 taking a long way around the monitor unit 304 situated at the back of the laser unit 302. Moreover, since the laser unit 302 is situated near the optical output port 303 in order to optically couple therewith in most cases, the co-planar line 307 which electrically connects the high frequency connector 305 and the amplifier 306, both being opposed to the optical output port 303, with the laser unit 302 becomes considerably long in conformity with the dimension of the module casing 301. Accordingly, the co-planar line 307 laid between the amplifier 306 and the laser unit 302 is long and comprises bent portions, hence it is difficult to maintain a satisfactory high frequency characteristic, and a tolerance in a fabricating process becomes severe. Moreover, since independent co-planar lines are necessary also, it becomes difficult to reduce the number of parts and fabricate the compact optical communication module because of increased length of the co-planar lines. As mentioned in the above, since the optical output port 303, the laser unit 302, the monitor unit 304 and the high frequency connector 305 are arranged nearly along a straight line, and especially the high frequency connector 305 and the optical output port 303 are arranged on a center line thereof, the conventional optical communication module is advantageous for an actual handling. However, as mentioned in the above, the conventional optical communication module is apt to cause troubles in a treatment of the high frequency signal, and cannot show satisfactory performances in operation in the high frequency region.

SUMMARY OF THE INVENTION

Accordingly, it is an object of the invention to provide an optical communication module which is small-sized and shows an excellent performances in an operation in a high frequency region by optimizing arrangements of parts to be installed therein and a high frequency input port fitted thereto.

According to the feature of the invention, an optical communication module comprises:

a module casing which comprises:

an optical device for emitting a modulated light used for an optical communication, a signal input terminal supplied with an input signal from an outside, and an amplifier for amplifying the input signal supplied from the signal input terminal and supplying the amplified input signal to the optical device, wherein the signal input terminal, the amplifier and the optical device are closely arranged nearly along a straight line in this order, and the signal input terminal and the amplifier are electrically connected with each other by a signal line of a co-planar structure.

BRIEF DESCRIPTION OF THE DRAWINGS

The invention will be explained in more detail in conjunction with the appended drawings, wherein.

DESCRIPTION OF THE PREFERRED EMBODIMENTS

Thereafter, embodiments of the invention will be explained referring to the appended drawings.

Figure 1:
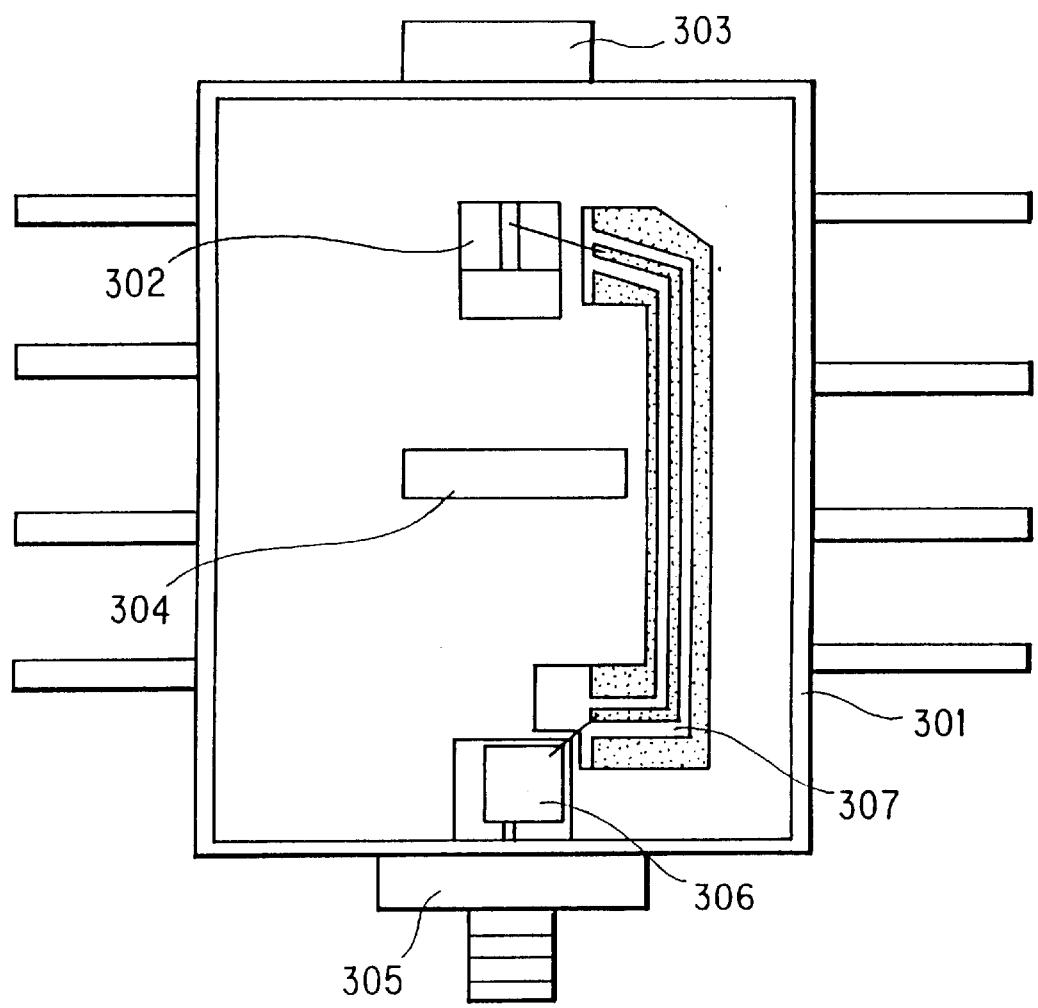
FIG. 1 is a plan view of an example of a conventional communication module.
Figure 2:
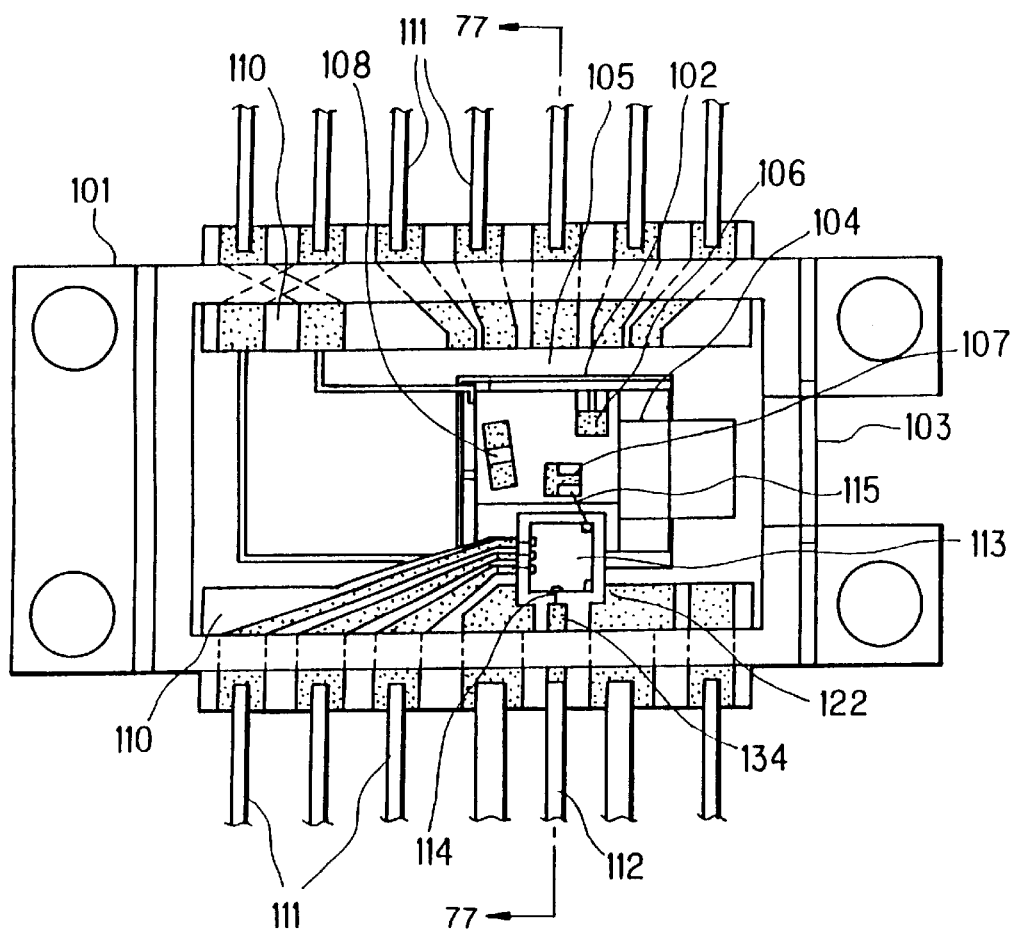
FIG. 2 is a plan view of an optical communication module according to the first preferred embodiment of the invention in a state that a cover thereof is removed.
Figure 3:
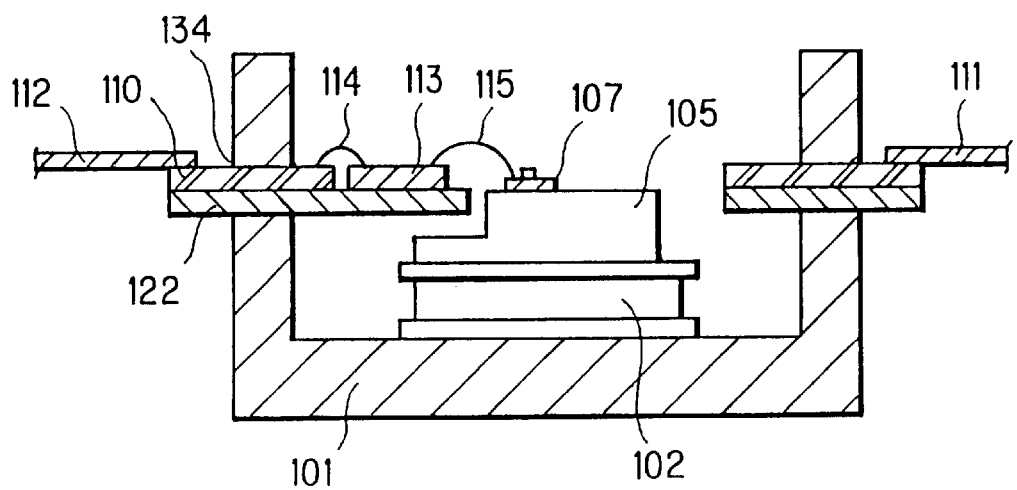
FIG. 3 is a cross-sectional view of an optical communication module shown in FIG. 1 in a 77—77 cross-section.

FIG. 2 is a plan view for showing an interior of an optical communication module according to the first preferred embodiment, which comprises an electroabsorption modulator integrated semiconductor laser serving as a light source and a built-in electrical signal amplifier. FIG. 3 is a cross-sectional view of the optical communication module shown in FIG. 1 in a 77—77 cross-section. A Peltier cooler 102 is situated in a module casing 101, and combined with a metallic block 105, on which a lens 104 is mounted. The lens 104 is optically coupled with an optical output port 103 which is positioned on a short side of the module casing 101 and formed of a transparent glass. Moreover, on the metallic block 105, a thermistor 105 for detecting the temperature of the metallic block 105 is mounted in order to control the temperature thereof by means of the Peltier cooler 102. Still more, an electroabsorption modulator integrated DFB laser diode 107 (a LD unit, hereinafter) and a monitoring photosensor 108 which monitors the output of the LD unit 107 in order to control a light intensity thereof are mounted on the metallic block 105. On the other hand, ceramic substrates 110 and 110' are fixed to both the long sides of the module casing 101. Plural signal pins are arranged on the ceramic substrates 110 and 110', and electrically and mechanically joined therewith via metallic patterns formed thereon by means of solder.

One of these plural signal pins 111 serves as a signal pin 112.

Moreover, a part of the ceramic substrate 110 approximates to the laser unit 107 from a direction perpendicular to an optical axis which is directed from the laser unit 107 to the optical output port 103.

An amplifier 113 which is formed as a semiconductor chip and serves as an electrical signal amplification circuit is mounted on the aforementioned part approximating to the laser unit 107 via a holder 122 and electrically connected with the laser unit 107. In order to realize the aforementioned structure, a portion of an upper part of the metallic block 105 is out off, and a part of the ceramic substrate 110 is extended into a space formed by the aforementioned process of cutting the block 105.

Figure 4:
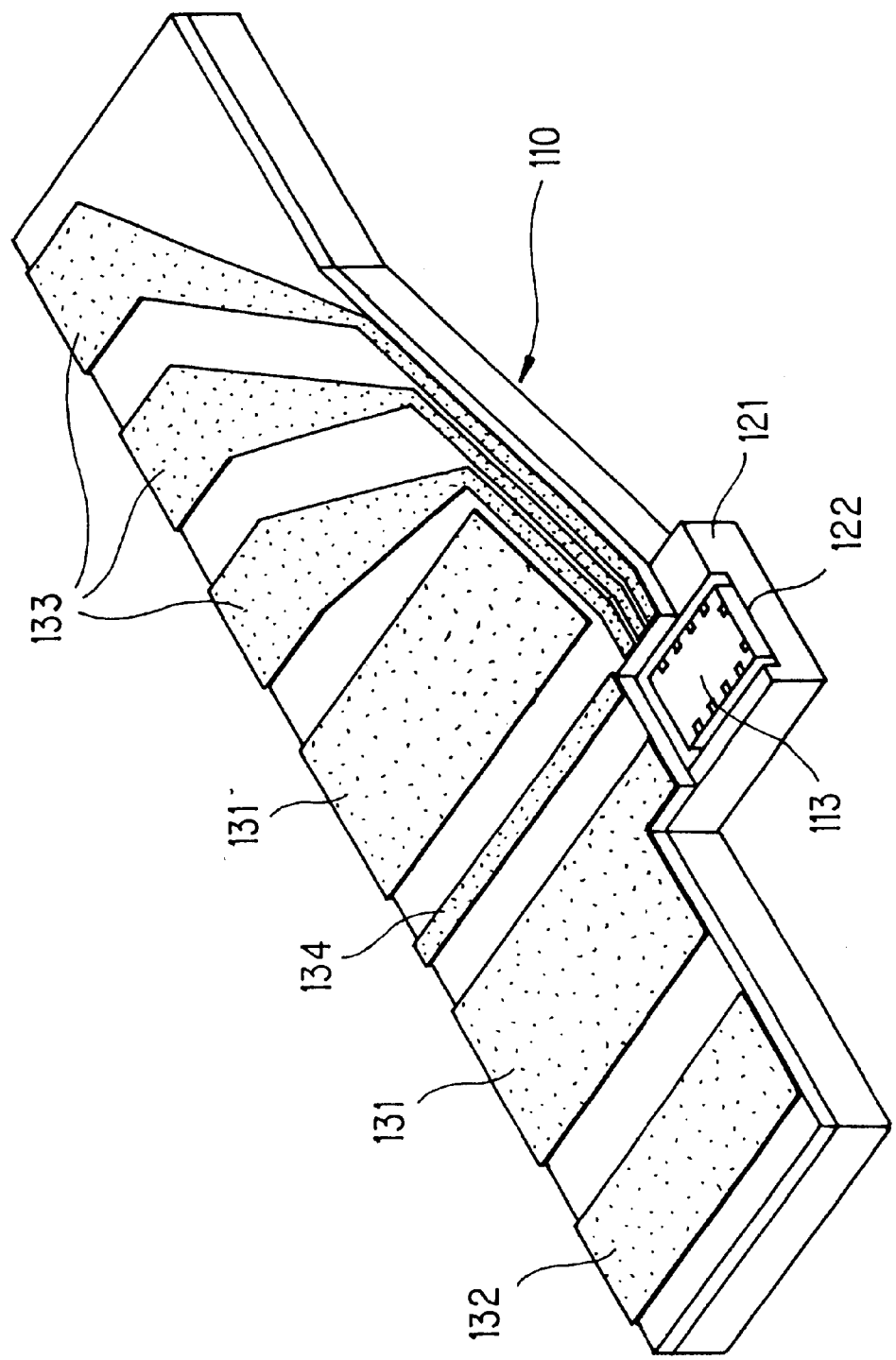
FIG. 4 is a perspective view of a ceramic substrate.

FIG. 4 is an enlarged perspective view of the ceramic substrate 110, a part of which approximates to the laser unit 107. The ceramic substrate 110 is adhered to an upper surface of the pedestal 121 having a thickness of 0.5 mm and formed of CuW. A holder 122 is formed by removing a part of the ceramic substrate 110 on the pedestal 121.

A part of a surface of the holder 122 is processed into a channel, and the aforementioned amplifier 113 is mounted on the channel by soldering. It is possible to suppress a heat resistance of the holder 122 within 8° C./W by making the thickness of the pedestal 121 be more than 0.5 mm, and an electrical power loss of 1 W dissipated in the electrical signal amplification circuit can be sufficiently radiated. A lateral leakage of solder for fixing the amplifier 113 can be prevented by a channel-like configuration of the holder 122.

Moreover, ground electrodes 131, a power-supply line 132, control lines 133 and a signal line 134, those being made of a thin metallic film and formed into desired patterns, are formed on a surface of the ceramic substrate 110, and respectively connected with the electrical signal pins 111 and 112. Especially, the signal line 134 constitutes co-planar lines together with the grounded electrodes 131, and straightforwardly patterned from the electrical signal input pins 112 to the amplifier 113. The amplifier 113 and the signal line 134 are electrically connected by a Au wire 114, and the amplifier 113 and the laser unit 107 are electrically connected by a Au wire 115. The lengths of the Au wires 114 and 115 are less than 1 mm, so that they can sufficiently respond to a high bit rate operation of about 10 Gb/s. The structure of the ceramic substrate 110' is similar to that of the ceramic substrate 110 except that the latter is provided with the amplifier and the signal line of a co-planar line structure.

In the aforementioned optical communication module, the signal input pin 112 supplied with a high frequency signal is electrically connected with the amplifier 113 and the laser unit 107 by means of the signal line 134 having a straight co-planar structure formed on the ceramic substrate 110 and the Au wires 114 and 115. Especially, the amplifier 113 is mounted on the holder 122 formed on a part of the pedestal 121, on which the ceramic substrate 110 having the signal line 134 thereon is extended. Moreover, the amplifier 113 approximates to the laser unit 107 from a direction perpendicular to the optical axis of the laser unit 107, in other words, the optical axis of the light emitted from the optical communication module, and is electrically connected therewith. Accordingly, the signal input pin 112 and the amplifier 113 is straightforwardly and electrically connected with each other by the signal line 134 and the Au wire 114 taking the shortest course. Moreover, the amplifier 113 and the laser unit 107 are electrically connected with each other by the Au wire 115 which is less than 1 mm long. As a result, the number or excessive parts, such as co-planar lines, can be cut down, and thereby the cost can be reduced, and the optical communication module with excellent performance in high bit rate operation can be provided. In this connection, according to the aforementioned embodiment, the optical communication module having the same shape and the same size as those of a butterfly module which is now typically used as a 2.5 Gb/s modulator integrated light source module can be fabricated.

Figure 5:
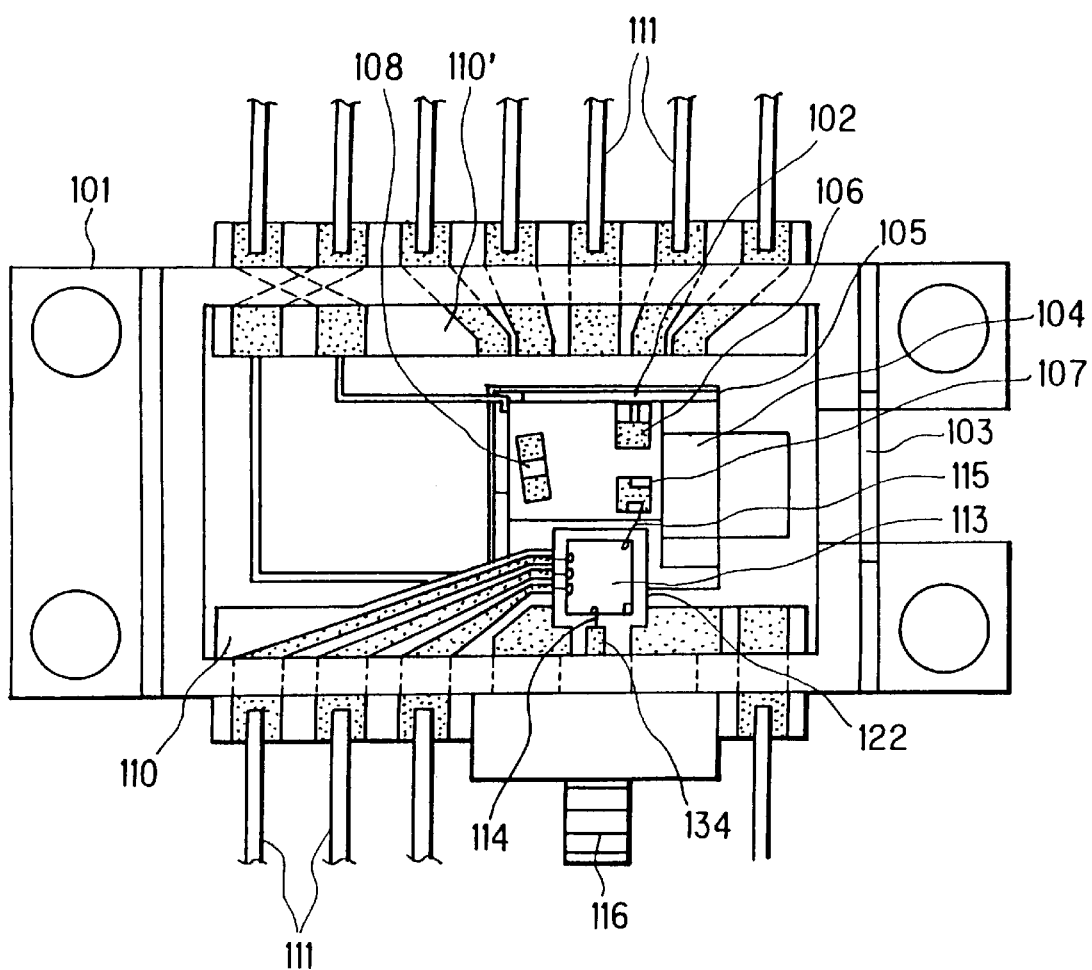
FIG. 5 is a plan view of an optical communication module according to the second preferred embodiment of the invention in a state that a cover thereof is removed.

FIG. 5 shows a plan view of an optical communication module according to the second preferred embodiment in a state that a cover thereof is removed, and structural elements or parts having the same functions as those used in the first preferred embodiment shown in FIG. 2 are expressed by the same notations. In the second preferred embodiment, a Peltier cooler 102 is situated in the module casing 101, and combined with a metallic block 105, on which a lens 104 is mounted, similarly to the first preferred embodiment shown in FIG. 2. A thermistor 106, and an electroabsorption modulator integrated DFB laser (a laser unit) 107, and a monitoring photosensor 108 are mounted on the metallic block 105. Along a long side of the module casing 101, a ceramic substrate 110 is fixed to the module casing 101, under which a pedestal 121 is formed similarly to the cases of FIGS. 2 to 4. An amplifier 113 is mounted on the pedestal 121, and approximates to the laser unit 107 from a direction perpendicular to the optical axis of the laser unit 107. Although plural electrical pins 111 are connected with the ceramic substrate 110 via metallic patterns, a SSMA high frequency connector 116 is provided for the module casing 101, a center conductor of which is connected with a signal line 134 of a co-planar structure formed on the ceramic substrate 110 instead of the signal input pin 112 used in the first preferred embodiment. The signal line 134 is connected with the amplifier 113 by an Au wire 114, and the amplifier 113 is connected with the laser unit 107 by the Au wire 115. The lengths of the Au wires 114 and 115 are less than 1 mm, so that they can sufficiently respond to a high bit rate operation of about 10 Gb/s.

Similarly to the case of the first preferred embodiment, in the optical communication module according to the second preferred embodiment, the high frequency connector 116 supplied with a high frequency signal is electrically connected with the amplifier 113 or the laser unit 107 by means of the signal line 134 having a straight co-planar structure formed on the ceramic substrate 110 and the Au wires 114 and 115. The amplifier 113 is mounted on the holder 122 formed on a part of the pedestal 121, on which the ceramic substrate 110 having the signal line 134 thereon is extended. Moreover, the amplifier 113 approximates to the laser unit 107 from a direction perpendicular to the optical axis of the laser unit 107, in other words, the optical axis of the light emitted from the optical communication module, and is electrically connected therewith. Accordingly, the high frequency connector 116 and the amplifier 113 is straightforwardly and electrically connected with each other by the signal line 134 and the Au wire 114 taking the shortest course.

Moreover, the amplifier 113 and the laser unit 107 are electrically connected with each other by the Au wire 115 which is less than 1 mm long. As a result, the number of excessive parts, such as co-planar lines, can be cut down, thereby the cost can be reduced, and the optical communication module with an excellent performance in a high bit rate operation can be provided. In this connection, according to the second preferred embodiment, the optical communication module having the same shape and the same size as those of a butterfly module which is now typically used as a 2.5 Gb/s modulator integrated light source module can be fabricated.

Figure 6:
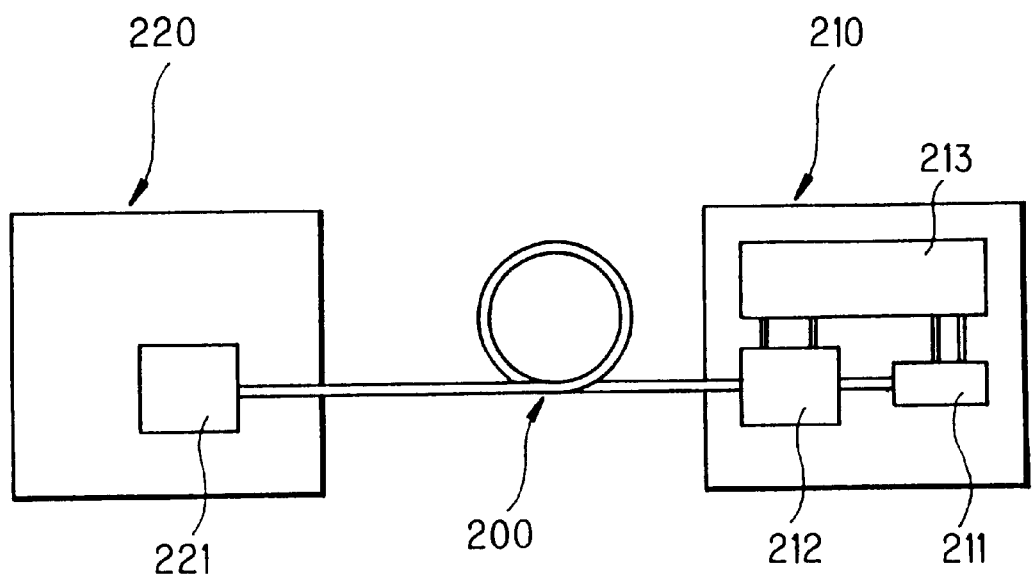
FIG. 6 shows an outline of an optical communication system comprising a modulator module according to the invention.

The embodiment of the invention is not restricted to the optical communication module in which a light source and a modulator are monolithically unified as shown in FIGS. 2, 3, or 5, but includes the same in which the light source and the modulator are respectively constituted as separate elements. FIG. 6 shows an outline of an optical communication system using an example of the optical communication modules of the latter type. An optical transmitter 210 comprises a light source 211, a modulator module 212 for modulating a light emitted from the light source 211, and a driving unit 213 for driving the light source 211 and the modulator module 212. The light emitted from the light source 211 is converted into an optical signal by the modulator module 212, propagates through an optical fiber 200, and detected by an optical receiving unit 221 in an optical receiver 220. In the modulator module 212 in the transmitter 210, if an electrical signal amplification circuit and a signal pin are arranged along a straight co-planar line and the electrical signal amplification circuit approximates to the modulator, the modulator module having an excellent performance in a high bit rate communication can be constructed.

As mentioned in above, in the optical communication module according to the invention, the signal input terminal, the amplifier and the laser unit are closely arranged nearly along a straight line in this order, and the signal input terminal and the amplifier are electrically connected with each other by the signal line of a co-planar structure. Then, a distance between the signal input terminal of the optical communication module and the amplifier, and the same between the amplifier and the laser unit can be minimized, and the length of the signal line of the co-planar structure can be shortened. As a result, the compact communication module having an excellent performance in a high bit rate communication can be provided.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An optical communication module, comprising:
 a module casing which comprises:
 an optical device for emitting a modulated light used for an optical communication;
 a signal input terminal supplied with an input signal from an outside; and
 an amplifier for amplifying said input signal supplied from said signal input terminal and supplying said amplified input signal to said optical device, wherein said signal input terminal, said amplifier and said optical device are arranged substantially along a straight line in this order, and said signal input terminal and said amplifier are electrically connected with each other by a single signal line of a co-planar structure positioned along said straight line arrangement of said signal input terminal, said amplifier, and said optical device.

2. An optical communication module comprising:

a module casing which comprises:

an optical device for emitting a modulated light used for an optical communication;

a signal input terminal supplied with an input signal from an outside; and an amplifier for amplifying said input signal supplied from said signal input terminal and supplying said amplified input signal to said optical device, wherein said signal input terminal, said amplifier and said optical device are arranged substantially along a straight line in this order, and said signal input terminal and said amplifier are electrically connected with each other by a signal line of a co-planar structure, wherein a metallic block provided with a Peltier cooler thereon is situated in said module casing, and wherein said optical device, a lens for outputting said light emitted from said optical device to said outside, a monitor for monitoring said light emitted from said optical device and controlling its light intensity, and a thermistor for detecting a temperature of said metallic block and controlling it by said Peltier cooler are mounted on said metallic block, and wherein said optical device is optically coupled with an optical output port formed on a part of said module casing via said lens.

3. An optical communication module, according to claim 2, wherein:

a pedestal formed of metal is situated at a position adjacent to said metallic block in said module casing, a ceramic substrate having said signal line formed thereon and said amplifier are mounted on said pedestal, and said amplifier is mounted on said pedestal at a region nearest to said optical device.

4. An optical communication module, according to claim 3, wherein:

a channel is formed on an upper part of said pedestal on which said ceramic substrate does not exist and said amplifier is fixed in said channel by soldering.

5. An optical communication module, according to claim 3, wherein:

said pedestal approximates to said optical device from a direction perpendicular to an optical axis of said light emitted from said optical device, and straight line passing near said signal input terminal, said amplifier and said optical device is directed perpendicularly to said optical axis of said light emitted from said optical device.

6. An optical communication module, according to claim 5, wherein:

an input end of said signal line is directly connected with said signal input terminal, an output end thereof is connected with said amplifier via an metallic wire, and said optical device is connected with said amplifier via another metallic wire.

7. An optical communication module, according to claim 6, wherein:

said metallic wire for connecting said amplifier with said output end of said signal line and said another metallic wire for connecting said amplifier with said optical device are respectively less than 1 mm long.

8. An optical communication module, according to claim 3, wherein:

said pedestal mounting said ceramic substrate is formed of CuW or Cu, and is more than 0.5 mm thick.

9. An optical communication module, according to claim 1, wherein said optical device comprises one of a semiconductor laser, a semiconductor modulator integrated laser, and a semiconductor modulator.

10. The optical communication module, according to claim 3, wherein said ceramic substrate includes ground electrodes, a power-supply line, and control lines formed on a surface thereof and connected with said signal input terminal.

11. The optical communication module, according to claim 10, wherein said ground electrodes, said power-supply line, and said control lines are each formed of a patterned thin metallic film.

12. The optical communication module, according to claim 1, wherein said optical device is optically coupled with an optical output port formed on a part of said module casing via a lens.

13. The optical communication module, according to claim 1, wherein a metallic block provided with a Peltier cooler thereon is situated in said module casing.

14. The optical communication module, according to claim 13, wherein said optical device, a lens for outputting said light emitted from said optical device to said outside, a monitor for monitoring said light emitted from said optical device and controlling its light intensity, and a thermistor for detecting a temperature of said metallic block and controlling it by said Peltier cooler are mounted on said metallic block.

15. The optical communication module, according to claim 1, wherein said module casing further comprises:

a monitoring unit for monitoring said modulated light emitted from said optical device, wherein said monitoring unit is located outside said straight line arrangement of said signal input terminal, said amplifier, and said optical device.

16. An optical communication module inside a module casing comprising:

a metallic block;

an optical device mounted on said metallic block for emitting a modulated light used for an optical communication;

a signal input terminal supplied with an input signal from an outside; and an amplifier for amplifying said input signal supplied from said signal input terminal and supplying said amplified input signal to said optical device, wherein said signal input terminal, said amplifier and said optical device are arranged substantially along a straight line in this order, and wherein said signal input terminal and said amplifier are electrically connected with each other by a single signal line of a co-planar structure positioned alone said straight line arrangement of said signal input terminal, said amplifier, and said optical device.

* * * * *